United States Patent [19]
Huang

[11] Patent Number: 5,394,430
[45] Date of Patent: Feb. 28, 1995

[54] LASER MODULE

[75] Inventor: Chaochi Huang, Taipei Hsien, Taiwan, Prov. of China

[73] Assignee: Quarton Inc., Taipei Hsien, Taiwan, Prov. of China

[21] Appl. No.: 237,132

[22] Filed: May 3, 1994

[51] Int. Cl.[6] .................................................. H01S 3/08
[52] U.S. Cl. ............................................ 372/107; 372/103; 372/108; 372/36; 257/684
[58] Field of Search .................. 372/107, 108, 103, 36, 372/43; 257/684, 723

[56] References Cited

U.S. PATENT DOCUMENTS

| | | | |
|---|---|---|---|
| 4,338,577 | 7/1982 | Sato et al. | 372/36 |
| 4,768,070 | 8/1988 | Takizawa et al. | 372/36 |
| 4,847,848 | 7/1989 | Inoue et al. | 372/108 |
| 4,890,296 | 12/1989 | Crosby | 372/107 |
| 5,073,047 | 12/1991 | Suzuki et al. | 257/684 |
| 5,283,802 | 2/1994 | Hsiung | 372/107 |

*Primary Examiner*—Georgia Y. Epps

[57] ABSTRACT

A laser module includes a hollow, cylindrical casing having a tapered laser beam emitting hole at one end and an inner thread at an opposite end; a lens mounted inside the casing and retained between a cushion ring and a locating ring; a base having an outer thread threaded into the inner thread on the casing; a laser diode chip and a photo detector mounted on the base and connected to contact pins of the base; a control circuit board fitted into the rear open end of the casing to block the base on the inside and electrically connected to the contact pins on the base for controlling the laser diode chip to emit a constant laser beam out of the tapered laser beam emitting hole via the lens.

7 Claims, 6 Drawing Sheets

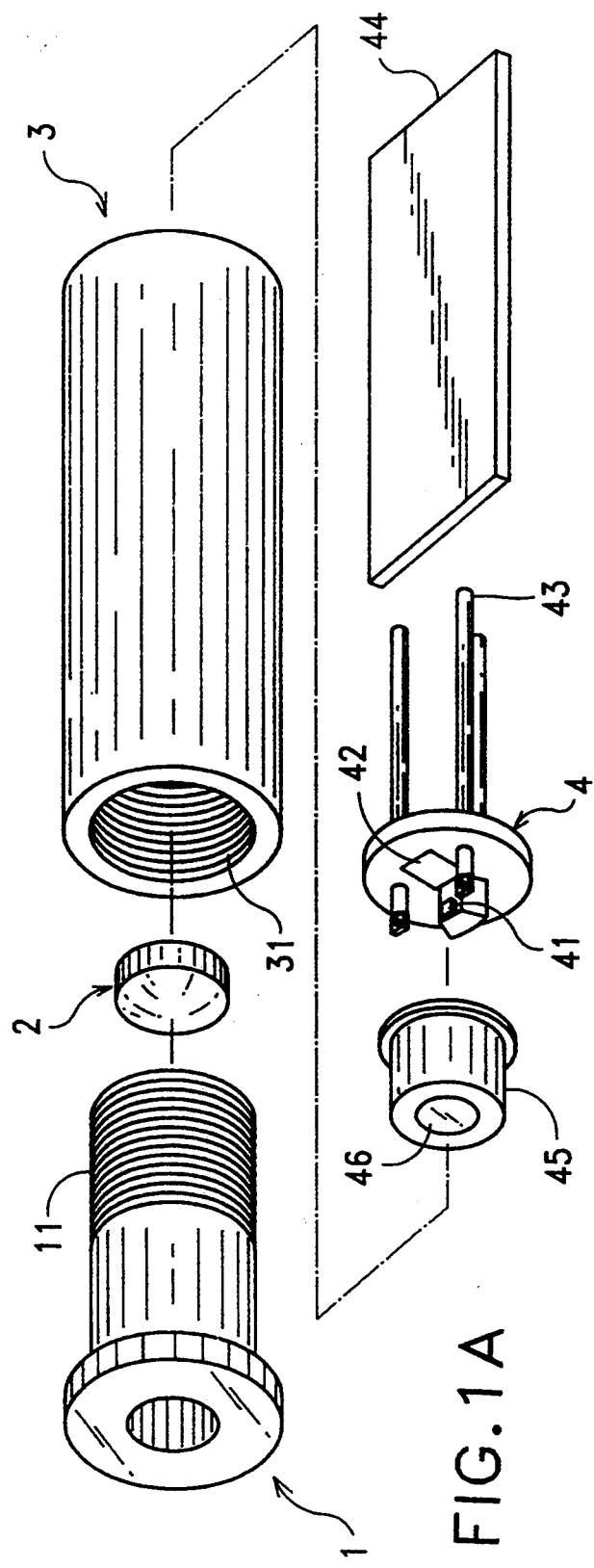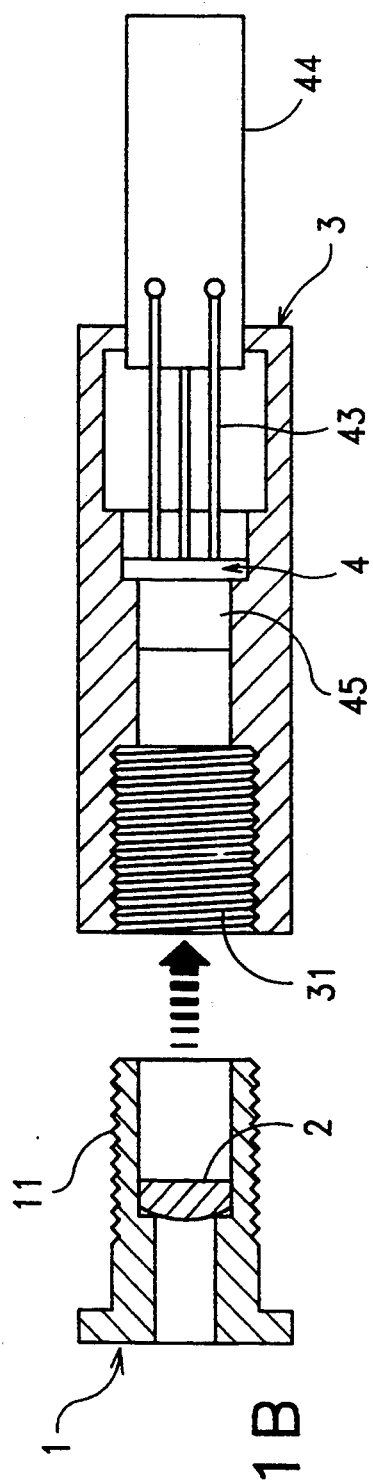
FIG.1A
FIG.1B

LASER MODULE

BACKGROUND OF THE INVENTION

The present invention relates to laser modules, and more particularly to a compact laser module which is simple in structure, easy to assemble, and practical in use.

Various laser modules have been designed for use in laser pointers, laser range finders, etc. FIGS. 1A and 1B show a prior art laser module which is generally comprised of a lens holder 1, a lens 2, a cylindrical casing 3, and a base 4. The lens 2 is mounted inside the stepped longitudinal through hole on the lens holder 1, with its convex surface disposed toward the front. The lens holder 1 has an outer thread 11 around the rear end thereof threaded into an inner thread 31 on the cylindrical casing 3. The base 4 is made of circular shape, having a LD (laser diode) chip 41 and a photo detector 42 at one side and a plurality of contact pins 43 at an opposite side. The base 4 is disposed inside the cylindrical casing 3. A protective cap 45 with a window glass 46 is covered on the base 4 over the LD chip 41 and the photo detector 42. The contact pins 43 of the base 4 are connected to a control circuit board 44. By means of turning the lens holder 1 relative to the cylindrical casing 3, the distance between the lens 2 and the LD chip 41 is adjusted. When adjusted, the connection between the lens holder 1 and the cylindrical shell 3 is sealed by a glue. The aforesaid laser module has drawbacks as outlined hereinafter.

i) The laser module is expensive to manufacture because it consists of a big number of component parts;
ii) The laser module is complicated to assemble and repair because its structure is complicated;
iii) The lens must fit in the stepped longitudinal through hole on the lens holder or it may displace, however, when fitting the lens into the lens holder the lens may be broken easily;
iv) The lens and the protective cap 45 are difficult to process because of their small sizes;
v) It is difficult to seal the protective cap to the base 4, and therefore the problem of high defective rate cannot be eliminated;
vi) The lens holder may be turned relative to the cylindrical casing, causing the focus changed; and
vii) When the laser beam from the LD chip passes through the lens, it may be partially refracted by the inside wall of the lens holder causing a halo to produce, and therefore the performance of the laser module is affected.

SUMMARY OF THE INVENTION

The present invention has been accomplished under the aforesaid circumstances. It is therefore an object of the present invention to provide a laser module which is compact and easy to assemble. It is another object of the present invention to provide a laser module of which the component parts can be conveniently installed without causing any damage to one another. It is still another object of the present invention to provide a laser module which is easy to repair. It is still another object of the present invention to provide a laser module which is inexpensive to manufacture. It is still another object of the present invention to provide a laser module of which the component parts are easy to process. It is still another object of the present invention to provide a laser module which has a front laser beam emitting hole made gradually bigger toward the outside that eliminates the formation of a halo.

BRIEF DESCRIPTION OF THE DRAWINGS

FIG. 1A is an exploded view of a laser module according to the prior art;

FIG. 1B is a longitudinal view in section of the laser module shown in FIG. 1A;

DETAILED DESCRIPTION OF THE PREFERRED EMBODIMENT

Figure 2:
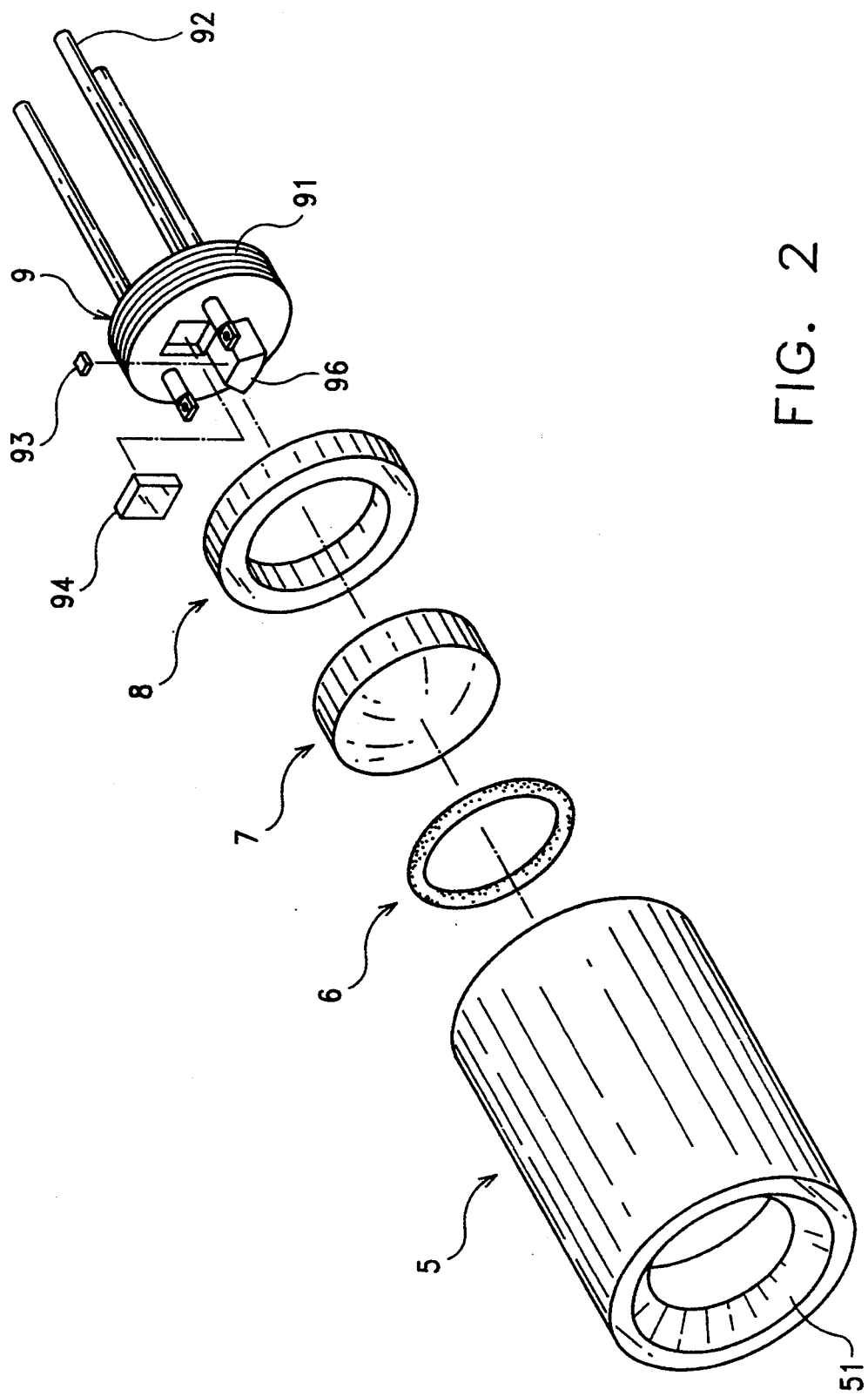
FIG. 2 is an exploded view of a laser module according to one embodiment of the present invention.
Figure 3A:
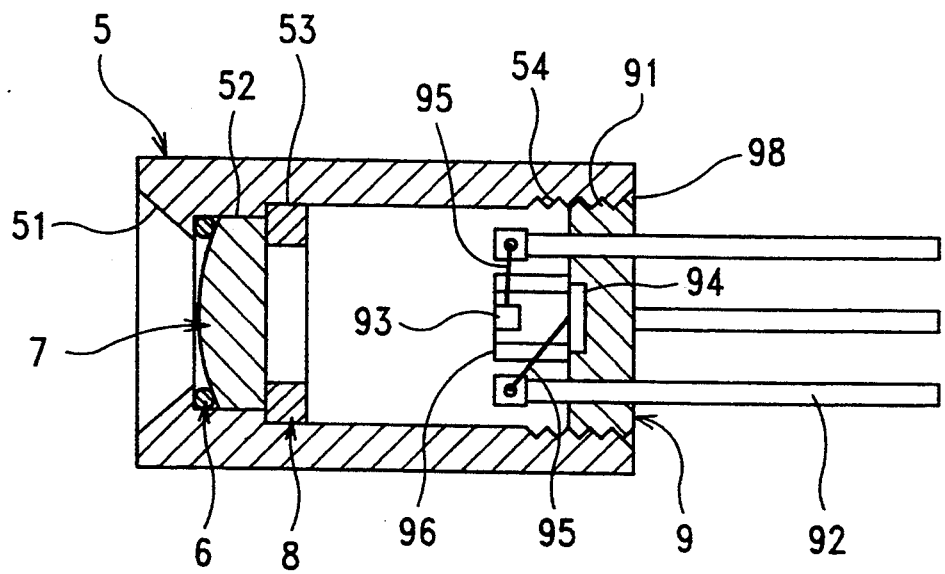
FIG. 3A is a longitudinal view in section of the laser module shown in FIG. 2.
Figure 3B:
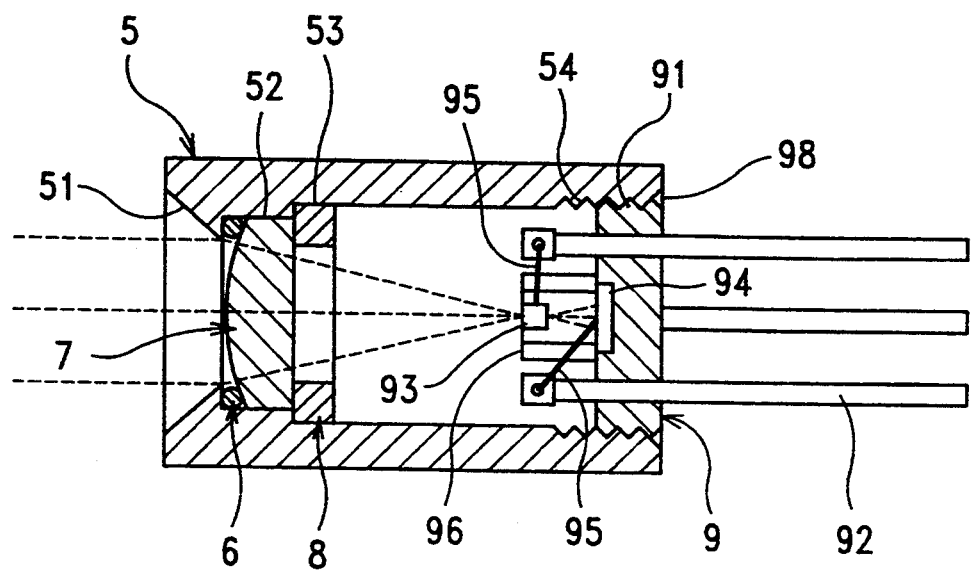
FIG. 3B is similar to FIG. 3A but showing a laser beam emitted.

Referring to FIGS. 2, 3A and 3B, a laser module in accordance with one embodiment of the present invention is generally comprised of a cylindrical casing 5, a cushion ring 6, a lens 7, a locating ring 8, and a base 9. The cylindrical casing 5 is made in a hollow structure having a tapered laser beam emitting hole 51 at one end made gradually bigger toward the outside, a lens coupling portion 52 disposed behind the tapered laser beam emitting hole 51, which receives the cushion ring 6 and the lens 7, a locating ring coupling portion 53 behind the lens coupling portion, which receives the locating ring 8 permitting the lens 7 to be firmly retained between the cushion ring 6 and the locating ring 8, and an inner thread 54 at an opposite end. The base 9 has an outer thread 91 threaded into the inner thread 54. After the outer thread 91 of the base 9 is threaded into the inner thread 54 of the cylindrical casing 5, the gap 98 between the base 9 and the cylindrical casing 5 is sealed by a sealing glue. Therefore, the inside space of the cylindrical casing 5 is sealed by the cushioning and the lens at one end and the base 9 and the sealing glue at an opposite end, and moisture is prohibited from entering the inside space of the cylindrical casing 5. The base 9 comprises a LD chip 93 and a photodetector 9 respectively disposed inside space of the cylindrical casing 5, and a plurality of contact pins 92 disposed outside the cylindrical casing 5 for connection to a control circuit board (not shown). The LD chip 93 is mounted on a platform 96 perpendicularly extended from the base 9. The photo detector 94 is directly mounted on the base 9. Therefore, the LD chip 93 and the photo detector 94 are arranged at right angles. The LD chip 93 and the photo detector 94 are connected to either contact pin 92 by a respective conductor 95. When the LD chip 93 is triggered to emit a laser beam, the photo detector 94 detects the intensity of the laser beam and sends a feedback signal to the control circuit board so that the control circuit board controls the LD chip 93 to provide a constant output power. When the LD chip 93 works, the laser beam is focused by the lens 7 and emitted through the laser beam emitting hole 51.

Figure 4A:
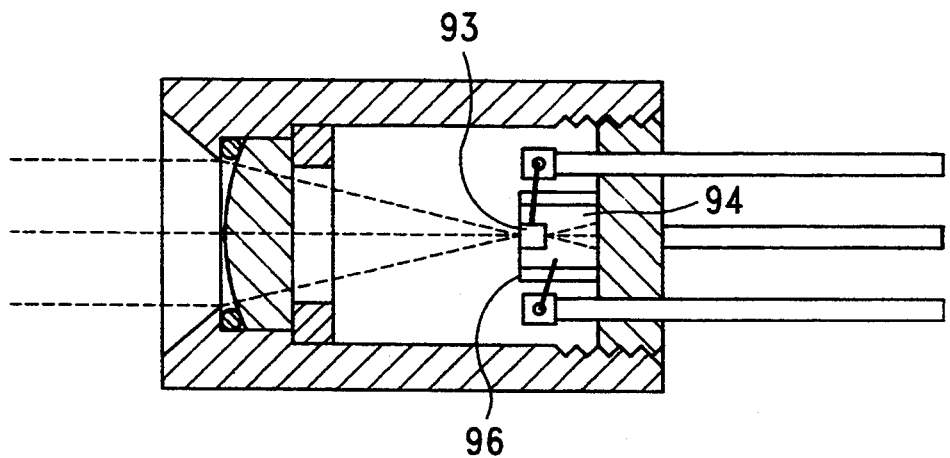
FIG. 4A is top view in section of an alternate form of the present invention.
Figure 4B:
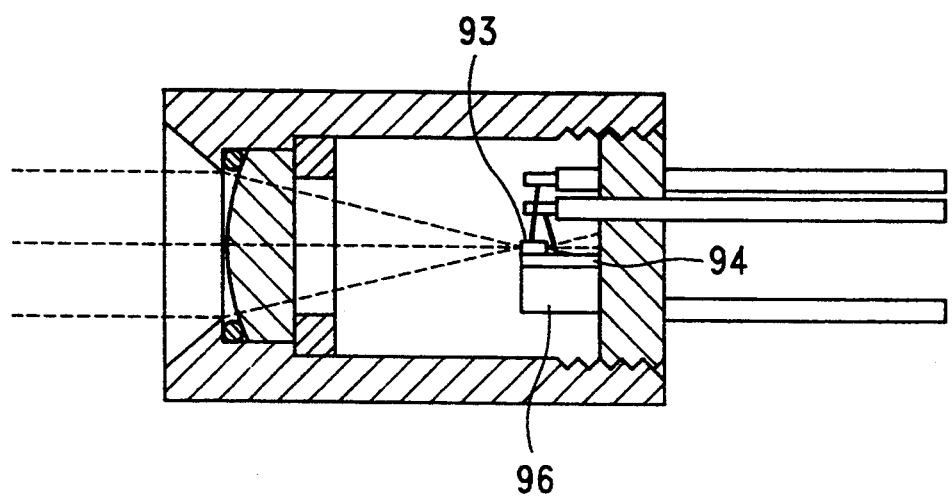
FIG. 4B is a side view in section of the alternate form of FIG. 4A.

Referring to FIGS. 4A and 4B, therein illustrated is an alternate form of the present invention in which the photo detector 94 is mounted on the platform, and the LD chip 93 is directly mounted the photo detector 94.

Figure 5A:
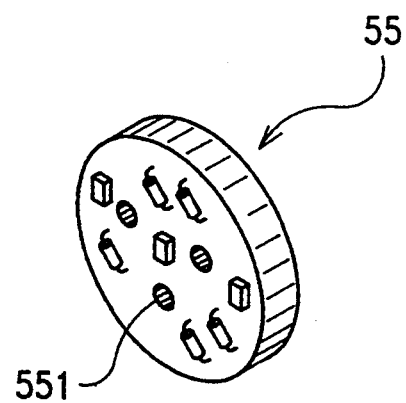
FIG. 5A is a perspective view of a circular control circuit board according to the present invention.
Figure 5B:
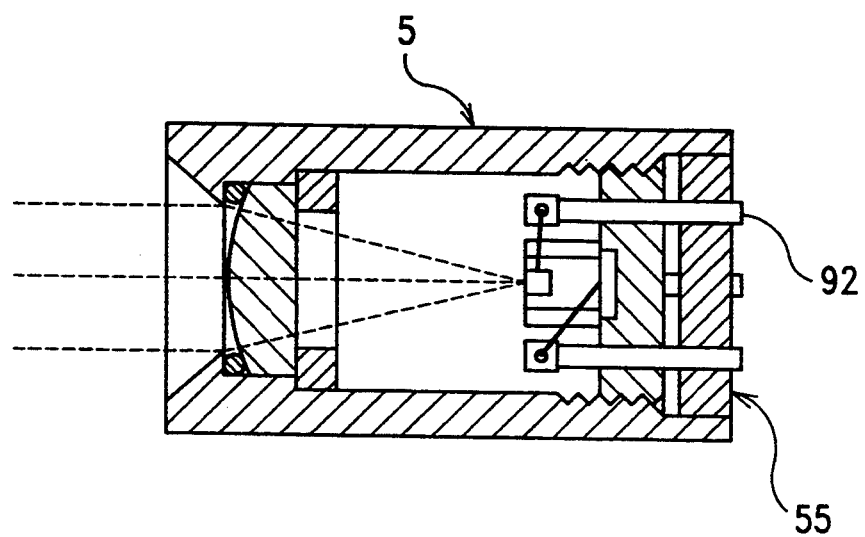
FIG. 5B is a longitudinal view in section of another alternate form of the present invention showing the circular control circuit board of FIG. 5A used.

Referring to FIGS. 5A and 5B, there is provided a circular control circuit board 55 having plurality of pin holes 551 for mounting the contact pins 92 of the aforesaid base 9. The circular control circuit board 55 fits into the rear end of the cylindrical casing 5 and is disposed behind the base 9, permitting the contact pins 92 of the base 9 to be respectively mounted in the pin holes 551 and welded to the circuit of the circular control circuit board 55. When installed, the gap between the circular control circuit board 55 and the cylindrical casing 5 is sealed by a sealing glue. This arrangement greatly shorten the combined length of the laser module and the control circuit board.

Figure 6A:
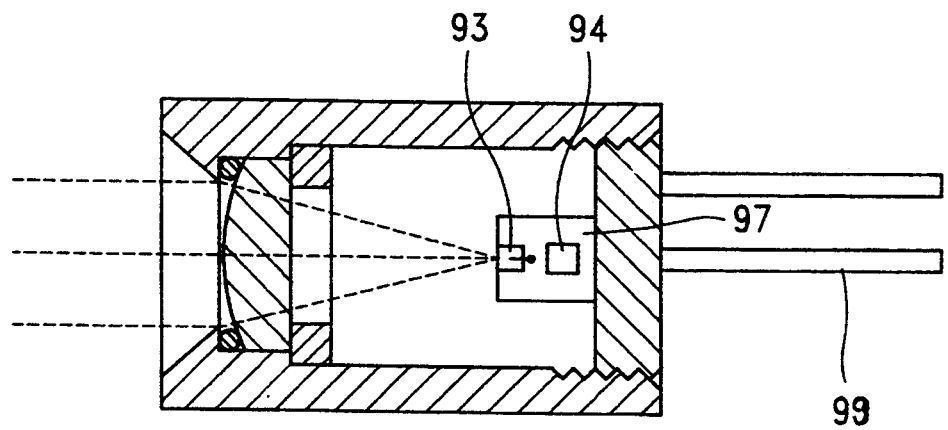
FIG. 6A is a top view, in section of still another alternate form of the present invention.
Figure 6B:
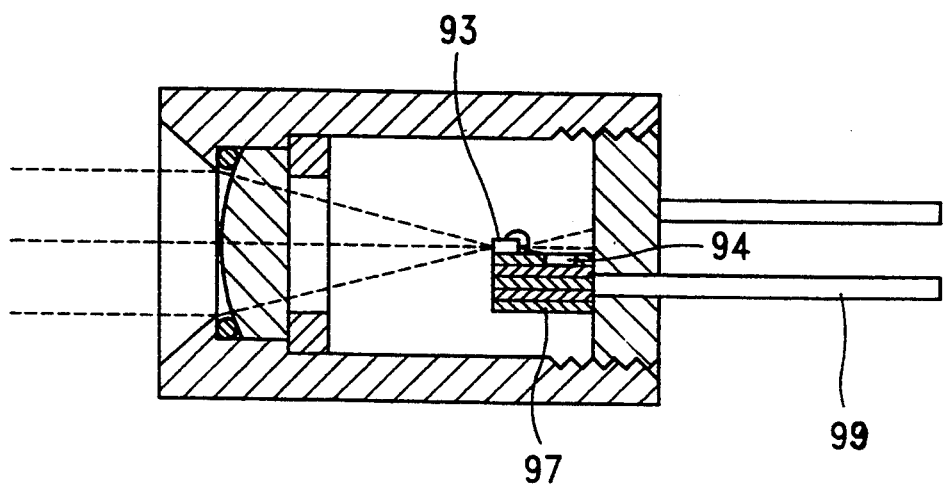
FIG. 6B is a side view in section of the alternate form of FIG. 6.

Referring to FIGS. 6A and 6B, therein illustrated is still another alternate form of the present invention, in which the photo detector 94 is mounted within a hole (not shown) on a semiconductor 97, and the LD chip 93 is mounted on the semiconductor 97 at the top near the front end thereof. This arrangement eliminates the arrangement of the aforesaid platform 96 and the control circuit board. Of course, the semiconductor 97 has contact pins 99 for connection to power supply. The LD chip 93 and the photo detector 94 may be arranged on the same plane as shown in FIGS. 6A and 6B, or at right angles as shown in FIG. 3A.

While only few embodiments of the present invention have been shown and described, it will be understood that various modifications and changes could be made without departing from the spirit and scope of the invention.

What is claimed is:

1. A laser module comprising:
   a hollow, cylindrical casing having a tapered laser beam emitting hole at one end made gradual bigger toward the outside, an inner thread at an opposite end, a lens coupling portion and a locating ring coupling portion disposed off the inside between said tapered laser beam emitting hole and said inner thread;
   a cushion ring mounted in said lens coupling portion;
   a locating ring mounted in said locating ring coupling portion;
   a lens mounted in said lens coupling portion and retained between said cushion ring and said locating ring; and
   a base having an outer thread threaded into the inner thread on said casing, said base comprising a laser diode chip and a photo detector at an inner side and contact pins at an outer side respectively connected to a control circuit board, said laser diode chip being controlled by said control circuit board to emit a laser beam out of said tapered laser beam emitting hole via said lens.

2. The laser module of claim 1 wherein said laser diode chip is mounted on a platform perpendicularly extended from said base, said photo detector is mounted on said base.

3. The laser module of claim 1 wherein said photo detector is mounted on a platform perpendicularly extended from said base, and said laser diode chip is mounted on said photo detector.

4. The laser module of claim 1 wherein said control circuit board is made of circular shape fastened to said casing outside said base, having a plurality of pin holes, which receives the contact pins of said base.

5. The laser module of claim 1 wherein when the outer thread of said base is threaded into the inner thread of said casing, the gap between said casing and said base is sealed by a sealing glue.

6. A laser module comprising:
   a hollow, cylindrical casing having a tapered laser beam emitting hole at one end made gradually bigger toward the outside, an inner thread at an opposite end, a lens coupling portion and a locating ring coupling portion disposed of the inside between said tapered laser beam emitting hole and said inner thread;
   a cushion ring mounted in said lens coupling portion;
   a locating ring mounted in said locating ring coupling portion;
   a lens mounted in said lens coupling portion and retained between said cushion ring and said locating ring;
   a semiconductor having an outer thread threaded into the inner thread on said casing; and
   a laser diode chip and a photo detector mounted on said semiconductor and controlled to emit a constant laser beam out of said tapered laser beam emitting hole via said lens.

7. The laser module of claim 6 wherein said photo detector is mounted within a hole on said semiconductor; said laser diode chip is mounted on said semiconductor near a front end thereof.

* * * * *